United States Patent
Cox et al.

(10) Patent No.: US 7,694,259 B2
(45) Date of Patent: Apr. 6, 2010

(54) DATA MODELS FOR DESCRIBING AN ELECTRICAL DEVICE

(75) Inventors: David Cox, Raleigh, NC (US); Thomas J Lanoue, Cary, NC (US)

(73) Assignee: ABB Research Ltd., Zurich (CH)

( * ) Notice: Subject to any disclaimer, the term of this patent is extended or adjusted under 35 U.S.C. 154(b) by 346 days.

(21) Appl. No.: 11/772,486

(22) Filed: Jul. 2, 2007

(65) Prior Publication Data
US 2007/0283309 A1    Dec. 6, 2007

Related U.S. Application Data

(63) Continuation of application No. 10/933,535, filed on Sep. 3, 2004, now Pat. No. 7,263,672.

(51) Int. Cl.
  G06F 9/455 (2006.01)
  G06F 17/50 (2006.01)
  G06F 9/44 (2006.01)
  G06F 9/445 (2006.01)

(52) U.S. Cl. .......... 716/11; 716/1; 716/3; 716/4; 716/5; 717/104; 717/174

(58) Field of Classification Search .......... 716/1, 716/3, 4, 5, 11; 717/104, 174
See application file for complete search history.

(56) References Cited

U.S. PATENT DOCUMENTS

| | | | |
|---|---|---|---|
| 4,986,124 A | 1/1991 | Byrne et al. | |
| 6,211,766 B1 | 4/2001 | Goseborg et al. | |
| 6,239,557 B1 | 5/2001 | Chang et al. | |
| 6,360,357 B1 * | 3/2002 | Cesare | 717/168 |
| 6,473,139 B1 | 10/2002 | George | |
| 6,516,451 B1 | 2/2003 | Patin | |
| 6,606,731 B1 | 8/2003 | Baum et al. | |
| 6,961,918 B2 | 11/2005 | Garner et al. | |
| 7,168,035 B1 | 1/2007 | Bell et al. | |
| 7,263,672 B2 | 8/2007 | Cox et al. | |
| 7,421,648 B1 | 9/2008 | Davis | |
| 7,475,000 B2 * | 1/2009 | Cook et al. | 703/14 |
| 2002/0156929 A1 | 10/2002 | Hekmatpour | |
| 2003/0208365 A1 | 11/2003 | Avery et al. | |

(Continued)

FOREIGN PATENT DOCUMENTS

EP    0 991 091 A1    4/2000

(Continued)

OTHER PUBLICATIONS

"The Impact of Inrush Currents on the Mechanical Stress of High Voltage Power Transformer Coils" by Michael Steurer, IEEE Transaction on Power Delivery, vol. 17, No. 1, Jan. 2002, pp. 155-160.

(Continued)

*Primary Examiner*—Helen Rossoshek
(74) *Attorney, Agent, or Firm*—Paul R. Katterle

(57) ABSTRACT

A method and product are described for creating a model of a physical layout and/or a circuit layout of an electrical device. The layouts are defined in a user interface. A text file having metadata elements in a hierarchical format is produced that can be used by other programs.

21 Claims, 6 Drawing Sheets

U.S. PATENT DOCUMENTS

| | | | |
|---|---|---|---|
| 2004/0007994 A1 | 1/2004 | Ribarich et al. | |
| 2004/0060014 A1 | 3/2004 | Khalil | |
| 2004/0172603 A1 | 9/2004 | Collmeyer et al. | |
| 2004/0207487 A1 | 10/2004 | Hayashi | |
| 2004/0220791 A1 | 11/2004 | Lamkin et al. | |
| 2005/0080502 A1 | 4/2005 | Chernyak et al. | |
| 2005/0096772 A1 | 5/2005 | Cox et al. | |
| 2005/0096774 A1 | 5/2005 | Bayoumi et al. | |
| 2005/0096886 A1 | 5/2005 | Smiley et al. | |
| 2005/0193361 A1 | 9/2005 | Vitanov et al. | |
| 2005/0278670 A1 | 12/2005 | Brooks et al. | |
| 2005/0289484 A1 | 12/2005 | Whitefoot et al. | |
| 2006/0053398 A1 | 3/2006 | Cox et al. | |
| 2006/0064667 A1 | 3/2006 | Freitas | |
| 2006/0085781 A1 | 4/2006 | Rapp et al. | |
| 2006/0155529 A1* | 7/2006 | Ludviksson et al. | 704/4 |
| 2006/0178864 A1 | 8/2006 | Khanijo et al. | |
| 2007/0027883 A1* | 2/2007 | Cox et al. | 707/100 |
| 2007/0234263 A1* | 10/2007 | Cox et al. | 716/11 |
| 2008/0244491 A1 | 10/2008 | Ganesan et al. | |

FOREIGN PATENT DOCUMENTS

| | | |
|---|---|---|
| EP | 0991092 | 4/2000 |
| WO | PCTUS2007025153 | 7/2008 |

OTHER PUBLICATIONS

Marino et al., "Creating an Abstraction of Sensors to Ease Usage, Distribution and Management of A Measurement Network", Sep. 16-19, 2003; Emerging Technologies and Factory Automation.

* cited by examiner

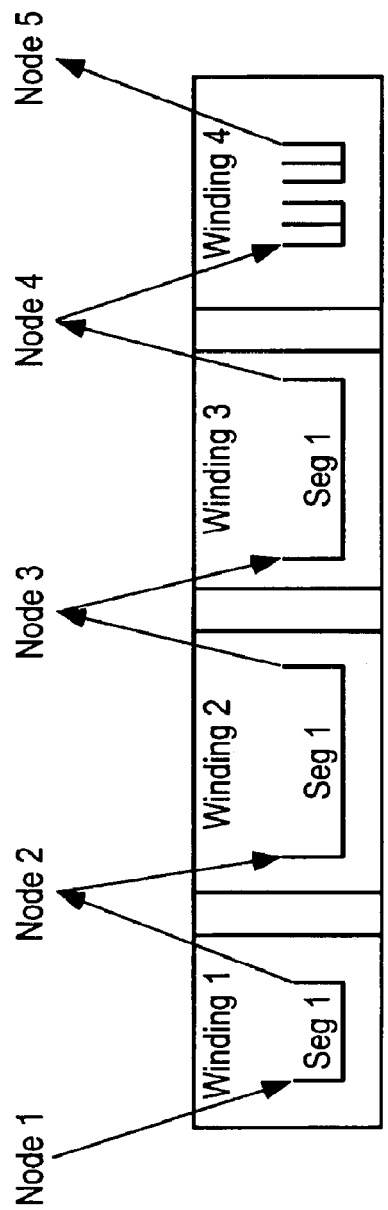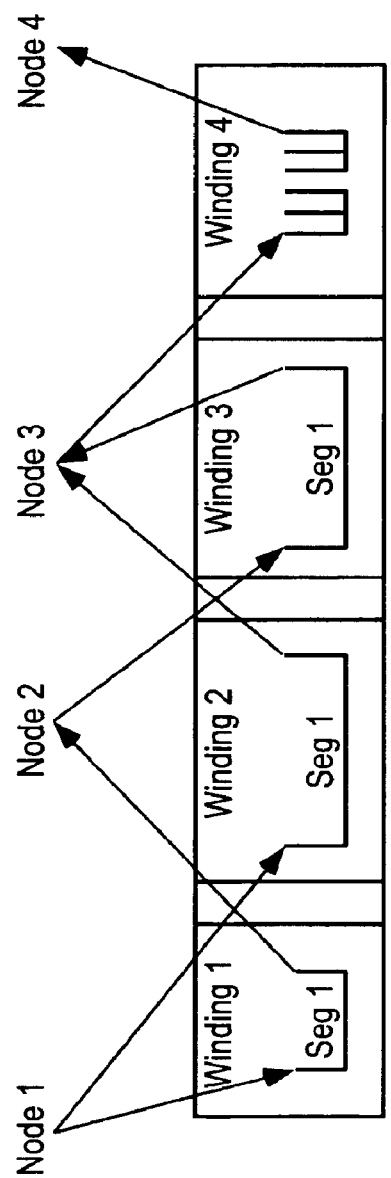
FIG. 4
FIG. 5

DATA MODELS FOR DESCRIBING AN ELECTRICAL DEVICE

CROSS-REFERENCE TO RELATED APPLICATION

This application is a continuation patent application of, and claims priority from, U.S. patent application Ser. No. 10/933,535, filed on Sep. 3, 2004, which is hereby incorporated by reference in its entirety.

BACKGROUND

Electrical devices can include many components arranged in a variety of physical arrangements. Describing the physical arrangements, i.e., physical layout or circuit layout, to a computer can often be time consuming. An electrical device can be defined using a complex computer programming language that involves many hours to produce.

SUMMARY

In accordance with the present invention, a computer-readable medium having computer-readable instructions for performing a method of forming a model of an electrical device is provided. In accordance with the method, a graphical user interface is generated. A plurality of blocks are made available for selection. The blocks include component blocks and orientation blocks. Each component block represents a component of the electrical device and each orientation block determines the position of a block that is a child to the orientation block relative to other blocks that are children of the orientation block. Selections of a plurality of blocks are received, wherein the selected blocks include a plurality of component blocks and one or more orientation blocks. A display is generated in the graphical user interface using the selected blocks. The display includes graphical representations of the selected component blocks that are arranged in a manner corresponding to the physical arrangement of the components in the electrical device so as to form an overall graphical representation of the electrical device. A metadata text file is generated using the selected blocks. The metadata text file defines a physical layout of the electrical device.

Also provided in accordance with the present invention is a computer-readable medium having computer-readable instructions for performing a method of forming a model of an electrical device. In accordance with the method, a graphical user interface is generated. A plurality of blocks are made available for selection. The blocks include component blocks, segment blocks and node blocks. Each component block represents a component of the electrical device, each segment block represents a subcomponent of one of the components of the electrical device and each node represents an end of one of the components of the electrical device or a junction of a plurality of the components of the electrical device. Selections of a plurality of blocks are received, wherein the selected blocks comprise component blocks, segment blocks and node blocks. A display is generated in the graphical user interface using the selected blocks. The display includes graphical representations of the selected blocks that are arranged in a manner so as to form an overall graphical representation of a circuit layout of the electrical device. A metadata text file is generated using the selected blocks. The metadata text file defines the circuit layout of the electrical device.

BRIEF DESCRIPTION OF THE DRAWINGS

The present invention will become apparent to those skilled in the art upon reading this description in conjunction with the accompanying drawings, in which like reference numerals have been used to designate like elements, and in which:

FIG. 4 illustrates an exemplary circuit layout for a transformer having four windings connected in series.

FIG. 5 illustrates an exemplary circuit layout for a transformer having four windings connected in parallel.

DETAILED DESCRIPTION

Exemplary embodiments of the present invention are directed to accurately defining and producing an electrical device in a manner which eliminates manual encoding by a programmer using a complex programming language. Methods, systems, and data models are employed to define a physical configuration (i.e., physical characteristics, such as the geometry of a physical layout and/or a circuit layout) of an electrical device. Metadata and a recursive data structure are used to produce a text file according to a metamarkup language, such as Extensible Markup Language ("XML"). Other metamarkup languages can be used to produce a text file.

Electrical devices can include, but are not limited to, capacitors, resistors, coils, switchgear, transformers, and the like. A transformer will be used for purposes of this description, but one of ordinary skill in the art will recognize that the techniques described herein can be extended to many other electrical devices.

Figure 1:
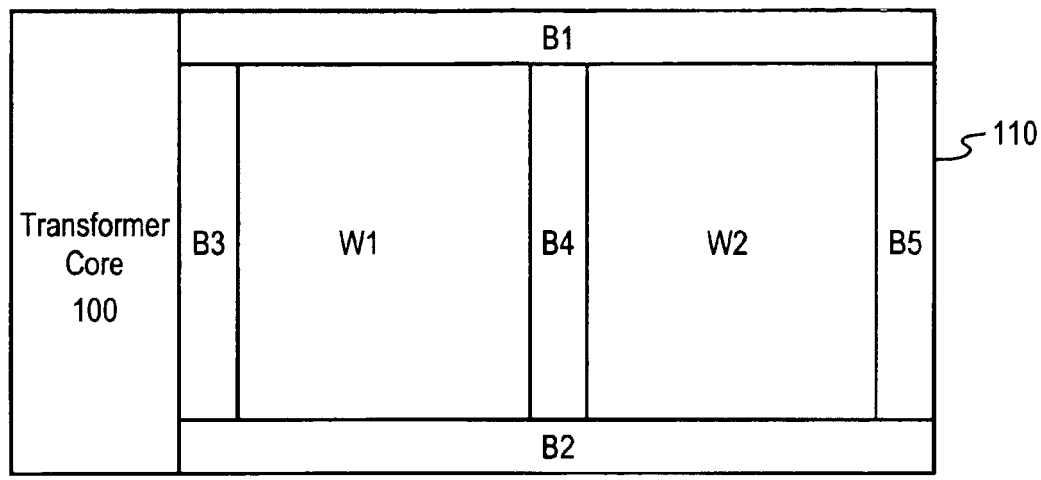
FIG. 1 illustrates an exemplary geometrical layout of a cross section of a transformer.

A geometrical layout of a cross section of a transformer is shown in FIG. 1. A transformer includes a core 100, which is shown only for orientation purposes. The transformer includes barriers B1-B5 and windings W1-W2. The barriers B1-B5 insulate windings W1-W2 from each other and therefore include insulating materials, such as resin, electrical glass, paper, and the like.

The physical layout of the barriers and windings can be described using a hierarchical data model. The data model includes an abstract component called a block to arrange barriers and windings either horizontally or vertically. A block can be either a horizontal block or a vertical block. A block can also include sub-blocks. For example, in FIG. 1, block 110 includes barrier B3, winding W1, barrier B4, winding W2, and barrier B5. The sub-blocks in a horizontal block are arranged horizontally. The sub-blocks in a vertical block are arranged vertically. A block can contain barriers, windings, and sub-blocks.

The physical layout in FIG. 1 can be defined using the following general hierarchical data model:

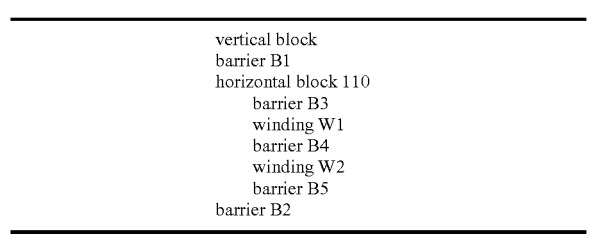

The vertical block defines the entire physical layout. The horizontal block 110 defines the middle section of the physical layout between the top and bottom barriers. Because blocks can contain sub-blocks any physical layout can be described using a hierarchical data model. Any metadata created to describe this physical layout must reflect this data model and its hierarchical nature.

A data model for defining a geometry of a physical layout of the electrical device of FIG. 1 as blocks and sub-blocks using a metamarkup language is shown below:

```
<physicalLayout layout="vertical">
    <barrier name="B1" />
    <block layout="horizontal">
        <barrier name="B3" />
        <winding="W1" />
        <barrier name="B4"/>
        <winding="W2"/>
        <barrier name="B5" />
    </block>
    <barrier name="B2" />
</physicalLayout>
```

The data model includes a metadata element for each block, and a metadata element, referred to herein as a child metadata element, for each sub-block associated with a respective block. The metadata elements are arranged in a hierarchical format. For example, indented under the metadata element <block layout="horizontal">are the child metadata elements for barrier B3, winding W1, barrier B4, winding W2, and barrier B5, in that order, as shown in FIG. 1. Each child metadata element is positioned in the data model between a start tag and an end tag of the metadata element. The metadata elements and child metadata elements can include an attribute, such as the term "name="B3"" in <barrier name="B3">.

Figure 2:
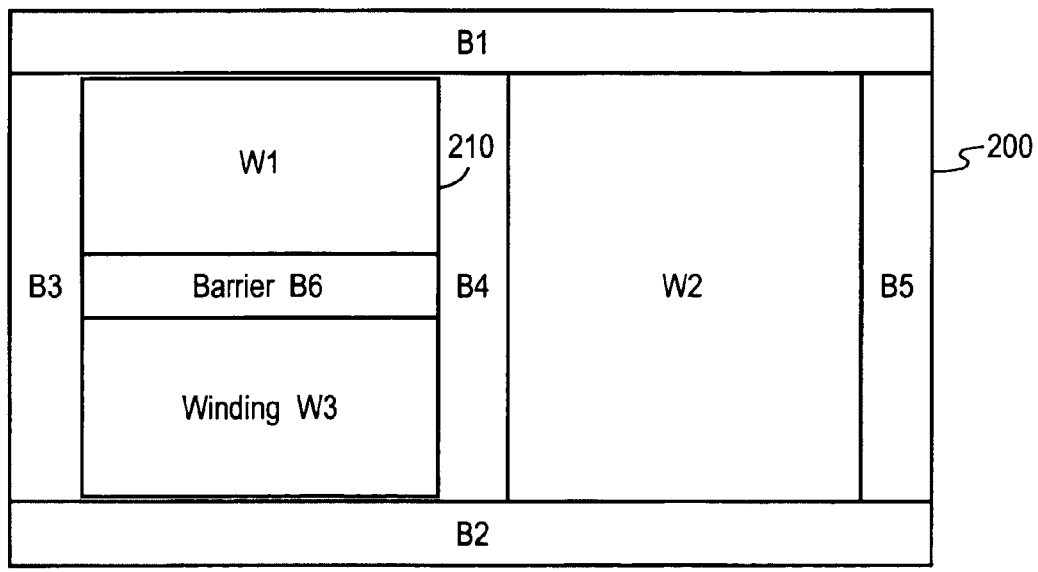
FIG. 2 illustrates another example of a geometrical layout of a cross section of a transformer.

FIG. 2 illustrates another example of a geometrical layout of a cross section of a transformer. In this example, a vertical block defines the entire physical layout, a horizontal block 200 defines the middle section of the physical layout between the top and bottom barriers B1, B2, and a vertical block defines the left section of the middle section between barriers B3 and B4. The physical layout in FIG. 2 can be defined using the following general hierarchical data model:

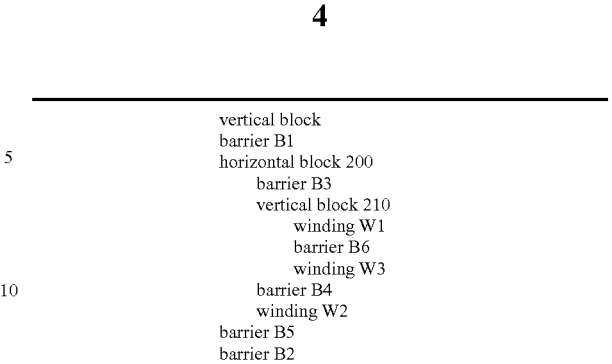

Figure 3:
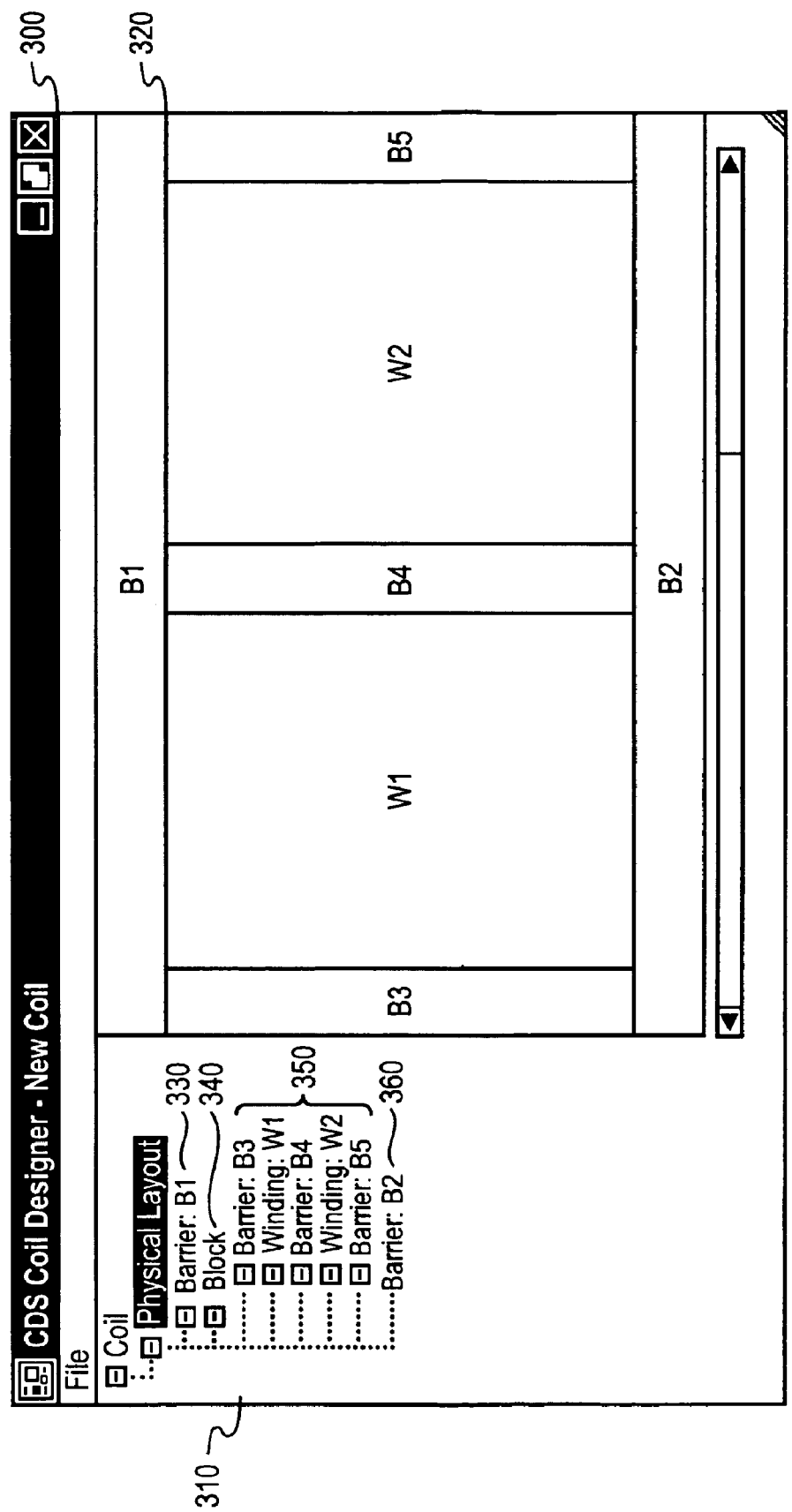
FIG. 3 illustrates an exemplary graphical user interface for creating a metadata text file corresponding to a geometry of a physical layout of an electrical device.

FIG. 3 is a computer graphics window 300 illustrating a graphical user interface for creating a metadata text file corresponding to a geometry of a physical layout of an electrical device. In the left pane 310 of the window is a tree view that shows a hierarchy of block identifiers. The right pane 320 shows a graphical representation of the physical layout.

Initially, the left pane 310 contains only a single block, called "Physical Layout" in FIG. 3, and the right pane 320 contains no barriers, windings, or blocks. A user adds block identifiers in the left pane 310 and the blocks are displayed in the right pane 320. The block identifiers are positioned sequentially according to the geometry of the physical layout. When the block contains a sub-block, a sub-block identifier representing the sub-block is added. For example, B3, W1, B4, W2, and B5 350 are sub-blocks within block 340. The sub-block identifier is positioned sequentially according to the geometry of the physical layout within the block, in this case, left-to-right. Each block or sub-block can have characteristics (e.g., shape (which, in an exemplary embodiment, can be assumed to be a particular shape, such as rectangle), position, orientation and size) stored in a file that is accessed by a drop down menu when a block or sub-block is selected by a user. The corresponding file is accessed from a memory of the computer to render an image of the block or sub-block in the pane 320. Alternately, an entire transformer configuration can be considered as an outermost block having a given shape and a given size. This information can be stored in the file, as an outermost block. Starting at an upper left hand corner of this outermost block, a drill down process can be used to fill in the various components of the outermost block. For example, this operation can begin by calculating the sizes of barriers based, for example, on an assumption that they correspond to a certain percentage of the displayable screen width. A further drill down can be used to determine space remaining after allocation of the barriers for allocation among all leftover components of the transformer. The operation can proceed recursively, repeatedly dividing the space until all blocks and sub-blocks within the transformer have been allocated. For each block, a recursive function can be used to draw the blocks, each of which can contain any number (i.e., 0 or more) of child nodes.

Many methods can be used to add the block identifiers into the left pane of the graphical user interface. For example, a user can right click "Physical Layout" using a computer mouse and a popup menu appears allowing the user to add a barrier, winding or a block. Alternatively, the user can type the block identifiers in using a keyboard. As block identifiers are added in the left pane 310, the blocks are generated and displayed in the right pane 320. For example, the user adds block identifiers for B1 330, B2 360, and the block 340 to the Physical Layout. Then the user would right click the block 340 and add block identifiers for B3, W1, B4, W2, and B5 350.

Once the physical layout is defined, a text file is generated by a computer processor and stored in a computer memory. The user can launch a command with the user interface, e.g., selects a file menu command, to initiate the generation of the text file, or it can be done automatically by the computer processor.

Exemplary functionality which can be performed by the computer processor to draw a physical layout of a transformer coil is embodied in the following pseudocode:

```
Transformer coils can be described using a tree data struc-
   ture. The object at the top of the tree is called a Block.
   The algorithm starts with this object.
The tree is organized specifically as a binary tree. There-
   fore, the algorithm can implement a type of binary tree
   traversal. As the algorithm traverses the tree it draws
   each item that it encounters. However, only Barriers and
   Windings are drawn. Blocks are never drawn. Blocks are
   internal nodes that hold other nodes (i.e. Barriers, Wind-
   ings, and other Blocks). When a Block is encountered
   during the traversal, the function, DrawPhysicalLayout,
   is called recursively.
Call DrawPhysicalLayout passing it the root of the tree, the
   x and y location for the drawing and the width and height
   of the drawing
function DrawPhysicalLayout(Block b, int x, int y, int
   width, int height)
   Count the number of child nodes
   Count the number of child nodes that are barriers
   Calculate the space occupied by all the barriers
   this equal number of barriers times the space of each
      barrier
   Calculate the space occupied by all the other child nodes
   this equals the total space minus the space occupied by
      the barriers
   Calculate the space of a single non-barrier child node
   this equals the non-barrier space/(total number of child
      nodes—number of barriers)
   Draw each child node starting at X and Y and working
      left to right
      if a node is a Barrier draw it in the space allocated
      else if a node is a Winding draw it in the space allo-
         cated
      else if a node is a Block call DrawPhysicalLayout
         passing the X and Y location of the Block and the
         width and height of the Block
   end Draw
end function
```

Figure 7:
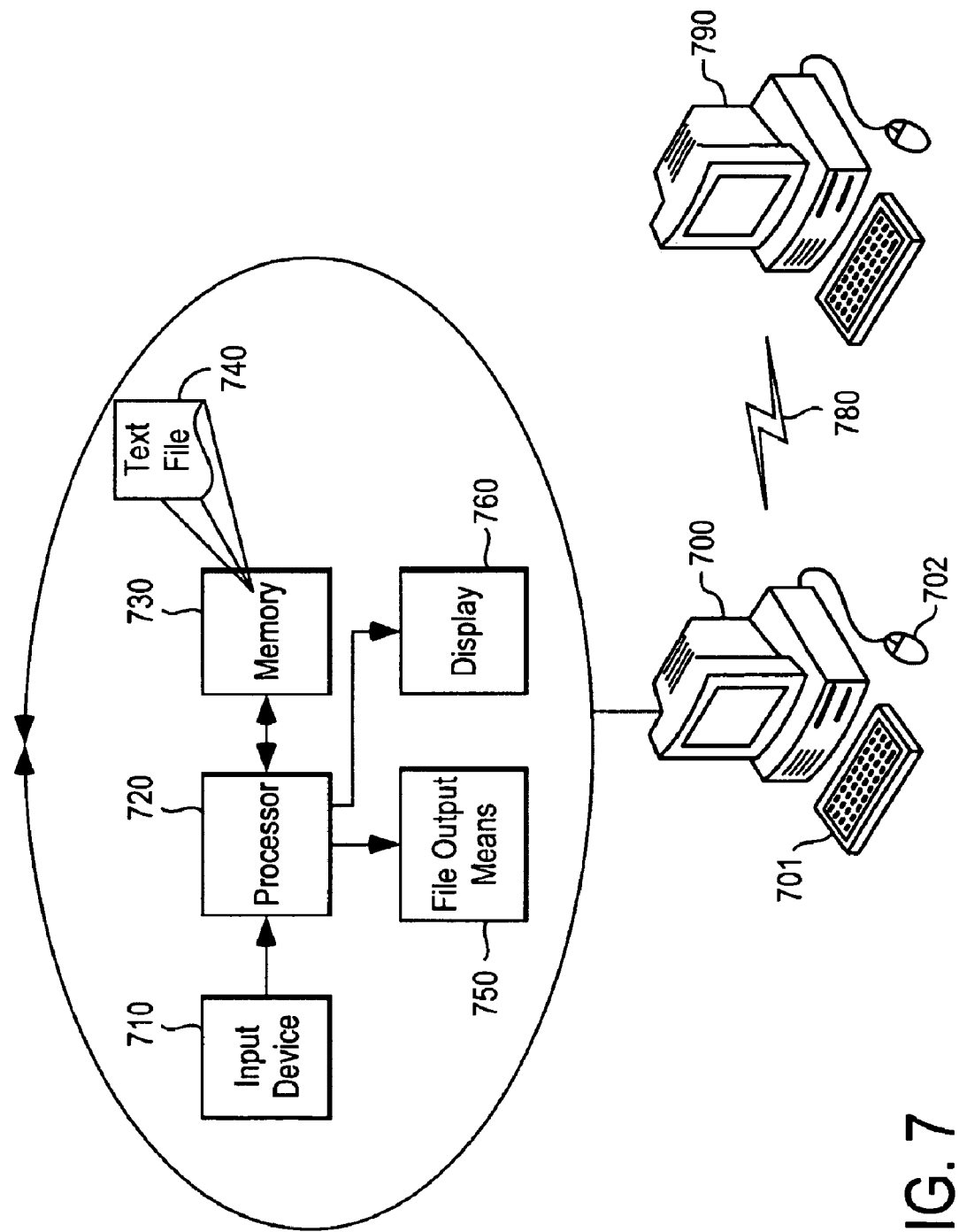
FIG. 7 illustrates an exemplary system for creating a metadata text file corresponding to a geometry of a physical layout and/or circuit layout of an electrical device.

A system for creating a metadata text file corresponding to a physical configuration, such as a geometry of a physical layout, of an electrical device is shown in FIG. 7. A computer 700 includes input means, such as a keyboard 701 and/or mouse 702, for defining a physical configuration of an electrical device. Processor means 720 are included for processing the physical configuration and for producing a text file having metadata elements, corresponding to the physical configuration, in a hierarchical format. Although a desktop computer 700 is shown for illustrative purposes, it should be understood that any device having a processor can be used, such as a laptop computer, a PDA, mobile station, and the like.

The input means 710 can be used to define a geometry of a physical layout of an electrical device as blocks and subblocks. The system also includes processor means 720 for processing the physical layout and producing a text file having metadata elements corresponding to the blocks in a hierarchical format, and memory means 730 for storing the text file 740. Display means 760 display a graphical representation of the physical layout of the electrical device. File output means 750 forward the text file to an application for processing. The file output means 750 can output the text file 740 to an application within the same computer 700 or to an application in another computer 790 via a communication network 780, wired or wireless, such as a LAN, the Internet, a WiFi connection, infrared, and the like.

Figure 8:
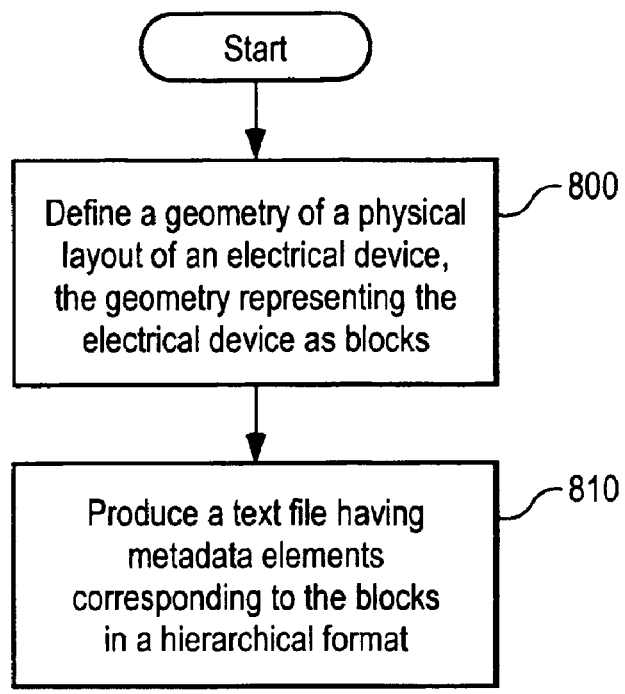
FIG. 8 is an exemplary flow chart illustrating a method for creating a metadata text file corresponding to a geometry and/or circuit layout of a physical layout and/or circuit layout of an electrical device.

FIG. 8 is a flow chart illustrating a method which corresponds to the foregoing pseudocode for creating a metadata text file corresponding to a geometry of a physical layout of an electrical device. A geometry of a physical layout of an electrical device is defined (800). The geometry represents the electrical device as blocks, as discussed above. A text file having metadata elements corresponding to the blocks in a hierarchical format is produced (810).

The foregoing describes use of a hierarchical data model to describe a geometry of a physical layout of an electrical device. According to another embodiment, a hierarchical data model can be used to describe a circuit layout of an electrical device. For example, FIG. 4 illustrates a circuit layout for a transformer having four windings 1-4 that are connected in series. The windings may include one or more segments connected together. In FIG. 4, windings 1-3 have one segment and winding 4 has five segments (i.e., wherein the middle segment is a break segment). Between each winding is a node. Current leaves a winding, flows to a node, and then flows into the next winding, as depicted by the arrows.

FIG. 5 illustrates a circuit layout for a transformer having the same four windings 1-4, but connected in parallel. As in FIG. 4, windings 1-3 have one segment and winding 4 has five segments. Current flow, however, is more complex. Current flows from Node 1 to windings 1 and 2. Current flows into Node 3 from windings 2 and 3. FIG. 5 illustrates how nodes can have multiple sources and destinations for current flow. Winding 4 consists of five segments. Unless current flow is redirected to a node, current will flow from one segment to the adjacent segment. The middle segment of winding 4 is a break segment. Current does not flow through a break segment per se. Instead, a break segment provides configurable electrical connections within winding 4 that connect segments before the break segment to those after the break segment.

A hierarchical data model is used to describe a circuit layout. At the top of the hierarchy is the entire circuit layout. At the next level of the hierarchy are windings and circuits. Below windings are the segments and below segments are the start and finish leads. Below circuits are the nodes. Below each node are the nodes' sources and destinations.

A data model for defining a circuit layout of an electrical device as windings, segments, and nodes using a metamarkup language includes a metadata element for each winding and a metadata element, referred to herein as a child metadata element, for each segment associated with a respective winding. The child metadata element is a child of a parent metadata element that corresponds to the respective winding. A node metadata element for each node is located at one of an end of a winding or a junction of multiple windings. The metadata elements and child metadata elements are arranged in a hierarchical format. Each child metadata element is positioned in the data model between a start tag and an end tag of the parent metadata element. The electrical device can be a transformer, for example, and a winding represents a winding of the transformer, one or more segments represent a winding configuration, and a node represents an end of a winding or a junction of multiple windings, as described above.

A data model for defining a circuit layout of FIG. 4 is shown below.

```xml
<CircuitLayout name="PC1">
    <Winding name="W1">
        <Segment name="S1">
            <StartLead name="s"/>
            <FinishLead name="f"/>
        <Segment>
    </Winding>
    <Winding name "W2">
        <Segment name="S1">
            <StartLead name="s"/>
            <FinishLead name="f"/>
        <Segment>
    </Winding>
    <Winding name "W3">
        <Segment name="S1">
            <StartLead name="s"/>
            <FinishLead name="f"/>
        <Segment>
    </Winding>
    <Winding name "W4">
        <Segment name="S1">
            <StartLead name="s"/>
            <FinishLead name="f"/>
        <Segment>
        <Segment name="S2">
            <StartLead name="s"/>
            <FinishLead name="f"/>
        <Segment>
        <Segment name="S3">
            <StartLead name="s"/>
            <FinishLead name="f"/>
        <Segment>
        <Segment name="S4">
            <StartLead name="s"/>
            <FinishLead name="f"/>
        <Segment>
        <Segment name="S5">
            <StartLead name="s"/>
            <FinishLead name="f"/>
        <Segment>
    </Winding>
    <Circuit name="C1">
        <Node name="N1">
            <Dst Winding="W1" Segment="S1" Lead="s" />
        </Node>
        <Node name="N2" >
            <Src Winding="W1" Segment="S1" Lead="f" />
            <Dst Winding="W2" Segment="S1" Lead="s" />
        </Node>
        <Node name="N3" >
            <Src Winding="W2" Segment="S1" Lead="f" />
            <Dst Winding="W3" Segment="S1" Lead="s" />
        </Node>
        <Node name="N4" >
            <Src Winding="W3" Segment="S1" Lead="f" />
            <Dst Winding="W4" Segment="S1" Lead="s" />
        </Node>
        <Node name="N5">
            <Src Winding="W4" Segment="S5" Lead ="f"; />
        </Node>
    </Circuit>
</CircuitLayout>
```

Figure 6:
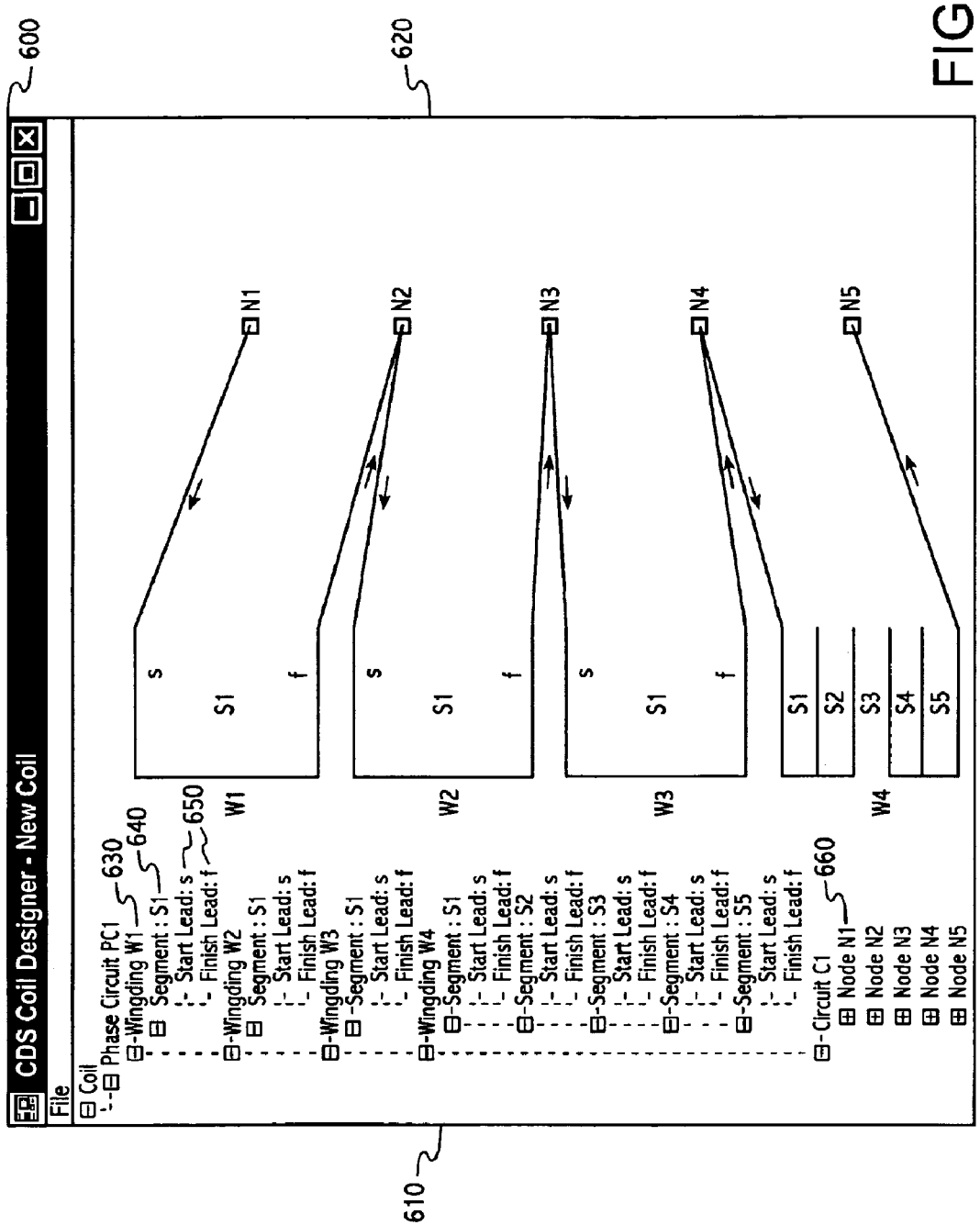
FIG. 6 illustrates an exemplary graphical user interface for creating a metadata text file corresponding to a circuit layout of an electrical device.

FIG. 6 is a computer graphics window illustrating a graphical user interface for creating a metadata text file corresponding to a circuit layout of an electrical device. In the left pane 610 of the window is a tree view that shows a hierarchy of block identifiers. The right pane 620 shows a graphical representation of the circuit layout. Initially, the left pane 610 contains only a single identifier, "Coil", in the example of FIG. 6, and the right pane 620 is empty. A user adds identifiers in the left pane 610 and the corresponding graphics are displayed in the right pane 620. For example, winding identifiers 630, segment identifiers 640, start/finish lead identifiers 650 and node identifiers 660 are added in left pane 610. The identifiers are positioned sequentially according to the circuit layout. For example, windings W1-W3 are shown, each with a segment S1, and winding W4 with segments S1-S5. Nodes N1-N5 are also shown.

The system of FIG. 7 can be used for creating a metadata text file corresponding to a circuit layout of an electrical device. Display means 760 display a graphical representation of the circuit layout of the electrical device corresponding to the winding identifier, segment identifiers, and node identifier.

Many methods can be used to add circuit layout components into the left pane. For example, a user right clicks "Coil" using the mouse 702 and a popup menu appears allowing the user to add a winding or circuit. Segments and nodes, respectively, can be added to the winding and circuit the same way. Alternatively, the user can type in the components using a keyboard 701. As circuit layout components are added in the left pane 610, the blocks are generated and displayed in the right pane 620. In this example, windings 1, 2, and 3 have one segment each. However, five segments were added to winding 4. Segment 3 in winding 4 is a break segment and can be designated as such on the right side by a different color. Sources and destinations can be added to each node 660.

Once the phase circuit is defined, the text file 740 is generated by the processor 720 and stored in the memory 730. The user can launch a command with the user interface, e.g., selects a file menu command, to initiate the generation of the text file 740, or it can be done automatically by the processor 720 for drawing a phase circuit diagram.

Exemplary functionality which can be performed by the processor 720 is embodied in the following pseudocode:

```
foreach winding contained in the phase circuit
    calculate the X and Y location for where the winding will be
        placed on the screen
    calculate the height and width of the winding
    calculate the height and width of each segment in the winding
    Save these values for later use
    draw rectangle for the winding
    foreach segment in the winding
        draw lines to represent each segment
        determine the type of segment
        fill in the segment's area with a color appropriate for
            its type
    end foreach
end foreach
foreach node in the circuit
    calculate the X and Y location for where the node will be placed
        on the screen
    calculate the height and width of the node
    draw rectangle for the node
    foreach source in the node
        determine the source's winding, segment, and lead the
            node is connected to
        draw a line and arrow from the source to the node
    end foreach
    foreach destination in the node
        determine the destination's winding, segment, and lead
            that the node is connected to
        draw a line and arrow from the node to the destination
    end foreach
end foreach
```

Figure 9:
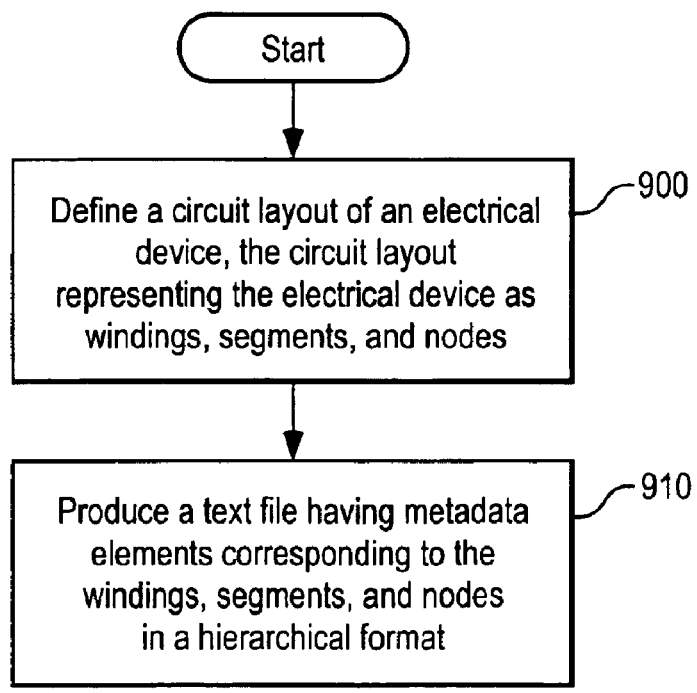
FIG. 9 is an exemplary flow chart illustrating a method for creating a metadata text file corresponding to a circuit layout of an electrical device.

FIG. 9 is a flow chart illustrating a method which corresponds to the foregoing pseudocode for creating a metadata text file corresponding to a circuit layout of an electrical device. A circuit layout of an electrical device is defined (900). The circuit layout representing the electrical device as windings, segments, and nodes. A text file having metadata elements corresponding to the windings, segments, and nodes in a hierarchical format is produced (910).

It should be emphasized that the terms "comprises", "comprising", "includes", and "including", when used in this description and claims, are taken to specify the presence of stated features, steps, or components, but the use of these terms does not preclude the presence or addition of one or more other features, steps, components, or groups thereof.

To facilitate an understanding of exemplary embodiments, many aspects are described in terms of sequences of actions that can be performed by elements of a computer system. For example, it will be recognized that in each of the embodiments, the various actions can be performed by specialized circuits or circuitry (e.g., discrete logic gates interconnected to perform a specialized function), by program instructions being executed by one or more processors, or by a combination of both.

Moreover, the sequences of actions can be embodied in any computer readable medium for use by or in connection with an instruction execution system, apparatus, or device, such as a computer based system, processor containing system, or other system that can fetch the instructions from a computer readable medium and execute the instructions.

As used herein, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer readable medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDROM).

Thus, the invention can be embodied in many different forms, and all such forms are contemplated to be within the scope of what is claimed. Any such form of embodiment can be referred to herein as "logic configured to" perform a described action, or alternatively as "logic that" performs a described action.

It will be appreciated by those of ordinary skill in the art that the invention can be embodied in various specific forms without departing from its essential characteristics. The disclosed embodiments are considered in all respects to be illustrative and not restrictive. The scope of the invention is indicated by the appended claims, rather than the foregoing description, and all changes that come within the meaning and range of equivalents thereof are intended to be embraced thereby.

What is claimed is:

1. A tangible computer-readable storage medium having computer-readable instructions for performing a method of forming a data model of an electrical device, the method comprising:
   (a.) generating a graphical user interface (GUI);
   (b.) making a plurality of blocks available for selection through the GUI, the blocks comprising:
      component blocks for identifying components of the electrical device; and
      orientation blocks for describing the spatial orientation of the components of the electrical device;
   (c.) receiving selections of a plurality of blocks through the GUI, wherein the selected blocks comprise a plurality of component blocks and one or more orientation blocks;
   (d.) generating a display in the graphical user interface using the selected blocks, the display comprising graphical representations of the selected component blocks that are arranged in a manner corresponding to the physical arrangement of the components in the electrical device so as to form an overall graphical representation of the electrical device; and
   (e.) generating a metadata text file using the selected blocks, the metadata text file describing a physical layout of the electrical device.

2. The computer-readable storage medium of claim 1, wherein the selected blocks are represented by block identifiers, respectively, and wherein the method further comprises displaying the block identifiers in the graphical user interface in a tree showing a hierarchical association of the block identifiers.

3. The computer-readable storage medium of claim 2, wherein the tree and the display are viewable in the same screen of the graphical user interface.

4. The computer-readable storage medium of claim 1, wherein the graphical user interface comprises pop-up menus through which a user may select blocks.

5. The computer-readable storage medium of claim 4, wherein a user may change the appearances of the graphical representations of the selected component blocks through the pop-up menus.

6. The computer-readable storage medium of claim 1, wherein the selected blocks comprise a first orientation block having a plurality of first component blocks as children, and wherein the first orientation block determines that the first component blocks are to be arranged horizontally.

7. The computer-readable storage medium of claim 6, wherein the selected blocks further comprise a second orientation block having the first orientation block and a plurality of second component blocks as children, and wherein the second orientation block determines that the first orientation block and the second component blocks are to be arranged vertically.

8. The computer-readable storage medium of claim 7, wherein one of the second component blocks is to be disposed above the first orientation block and a second one of the component blocks is to be disposed below the first orientation block.

9. The computer-readable storage medium of claim 8, wherein the electrical device is a transformer.

10. The computer-readable storage medium of claim 9, wherein the first component blocks represent windings of the transformer and the second component blocks represent barriers of the transformer.

11. The computer-readable storage medium of claim 1, wherein the metadata text file comprises a metadata element for each selected block, and wherein the metadata element for a selected block that is a child to another selected block is a child metadata element to the metadata element for the other selected block.

12. The computer-readable storage medium of claim 11, wherein the metadata elements are arranged in a hierarchical format that corresponds to the physical layout of the electrical device.

13. A tangible computer-readable storage medium having computer-readable instructions for performing a method of forming a model of an electrical device, the method comprising:
   (a.) generating a graphical user interface;
   (b.) making a plurality of blocks available for selection, the blocks comprising:
      component blocks for identifying components of the electrical device;

segment blocks for identifying subcomponents of the components of the electrical device; and node blocks for identifying ends of the components of the electrical device and junctions between the components of the electrical device;

(c.) receiving selections of a plurality of blocks, wherein the selected blocks comprise component blocks, segment blocks and node blocks;

(d.) generating a display in the graphical user interface using the selected blocks, the display comprising graphical representations of the selected blocks that are arranged in a manner so as to form an overall graphical representation of a circuit layout of the electrical device; and (e.) generating a metadata text file using the selected blocks, the metadata text file describing the circuit layout of the electrical device.

14. The computer-readable storage medium of claim 13, wherein the selected blocks are represented by block identifiers, respectively, and wherein the method further comprises displaying the block identifiers in the graphical user interface in a tree showing a hierarchical association of the block identifiers.

15. The computer-readable storage medium of claim 14, wherein the tree and the display are viewable in the same screen of the graphical user interface.

16. The computer-readable storage medium of claim 13, wherein the graphical user interface comprises pop-up menus through which a user may select blocks.

17. The computer-readable storage medium of claim 13, wherein each selected segment block is a child block to one of the component blocks, and wherein the metadata text file comprises a metadata element for each block.

18. The computer-readable storage medium of claim 13, wherein the metadata element for each segment block is a child metadata element to the metadata element for the component block for which the segment block is a child block.

19. The computer readable storage medium of claim 18, wherein the metadata elements are arranged in a hierarchical format in which the metadata elements for the components blocks and the segment blocks are listed before the metadata elements for the node blocks.

20. The computer readable storage medium of claim 13, wherein the blocks available for selection further comprise start lead blocks and finish lead blocks for identifying input and outputs, respectively, of the subcomponents of the electrical device, and wherein the selected blocks further comprise start lead blocks and finish lead blocks.

21. The computer readable storage medium of claim 13, wherein the electrical device is a transformer and the component blocks represent the windings of the transformer.

* * * * *